(12) United States Patent
Udo et al.

(10) Patent No.: US 6,969,990 B2
(45) Date of Patent: Nov. 29, 2005

(54) CEILING BOARD, DESIGNING METHOD FOR CEILING BOARD, MANUFACTURING METHOD FOR CEILING BOARD, MAGNET COVER, MAGNET SYSTEM AND MAGNETIC RESONANCE IMAGING APPARATUS

(75) Inventors: Yoshiro Udo, Tokyo (JP); Seiichi Kitagawa, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 696 days.

(21) Appl. No.: 10/165,154

(22) Filed: Jun. 7, 2002

(65) Prior Publication Data

US 2002/0188192 A1 Dec. 12, 2002

(30) Foreign Application Priority Data

Jun. 8, 2001 (JP) ........................... 2001-173896

(51) Int. Cl.[7] ................................. G01V 3/00
(52) U.S. Cl. ....................... 324/300; 324/318
(58) Field of Search ................... 324/300, 318, 324/322, 309, 307; 600/410; 211/70.6; 362/148

(56) References Cited

U.S. PATENT DOCUMENTS

| | | | |
|---|---|---|---|
| 2,371,421 A | * | 3/1945 | Blaski ........................ 52/478 |
| 3,557,777 A | | 1/1971 | Cohen |
| 4,816,760 A | | 3/1989 | Svegander et al. |
| 5,018,724 A | | 5/1991 | Naser et al. |
| 5,152,288 A | | 10/1992 | Hoenig et al. |
| 5,265,611 A | | 11/1993 | Hoenig et al. |
| 5,617,856 A | | 4/1997 | Tamura et al. |
| 6,474,831 B1 | * | 11/2002 | Ruuttu et al. ............... 362/148 |

* cited by examiner

*Primary Examiner*—Brij B. Shrivastav
(74) *Attorney, Agent, or Firm*—Carl B. Horton, Esq.; Armstrong Teasdale LLP

(57) ABSTRACT

A ceiling board free from trouble due to bending is to be provided. In the ceiling board to be supported horizontally by its peripheral parts as fixed parts, the part between the fixed parts, in a state wherein it is bent by its own weight, is formed in a dome shape in a direction reverse to the direction of bending by the part's own weight so that the board surface be horizontal.

28 Claims, 10 Drawing Sheets

112a

112a

CEILING BOARD, DESIGNING METHOD FOR CEILING BOARD, MANUFACTURING METHOD FOR CEILING BOARD, MAGNET COVER, MAGNET SYSTEM AND MAGNETIC RESONANCE IMAGING APPARATUS

CROSS REFERENCE TO RELATED APPLICATION

This application claims the benefit of Japanese Application No. 2001-173896 filed Jun. 8, 2001.

BACKGROUND OF THE INVENTION

The present invention relates to a ceiling board, a designing method for the ceiling board, a manufacturing method for the ceiling board, a magnet cover, a magnet system and a magnetic resonance imaging apparatus, and more particularly to a horizontally supported ceiling board, a designing method for such a ceiling board, a manufacturing method for such a ceiling board, a magnet cover having such a ceiling board, and a magnet system having such a cover, and a magnetic resonance imaging apparatus provided with such a magnet system.

In a magnetic resonance imaging (MRI) apparatus, the subject of imaging is brought into the internal space of its magnet system, i.e. an imaging space in which a magnetostatic field is formed, a gradient magnetic field and a high frequency magnetic field are applied to the subject, magnetic resonance signals are generated from spins therein, and an image is reconstructed on the basis of the signals so received.

A magnet system of a vertical magnetic field type has a magnet body having an upper pole section and a lower pole section opposite to each other in the vertical direction with the imaging space between them. The magnet body is housed in a magnet cover. The magnet cover has a ceiling board covering the end face of the upper pole section and a floor board covering the end face of the lower pole section, and the space between these ceiling board and floor board serves as the imaging space. In a full human body size magnetic resonance imaging apparatus, the diameter of the upper pole section and the lower pole section is almost 1 m, and the ceiling board and the floor board have correspondingly large diameters.

In order to efficiently form a required magnetic field space, as a magnet system has its upper pole section and lower pole section to be opposite to each other at the minimum required distance between them, the distance between the ceiling board and the floor board tends to be short. Therefore, when the ceiling board is bent by its own weight, its distance from the floor board is correspondingly shortened, making it more difficult for a patient with a head coil on, for instance, to be brought into the imaging space.

SUMMARY OF THE INVENTION

Therefore, an object of the present invention is to realize a ceiling board free from trouble due to bending, a designing method for such a ceiling board, a manufacturing method for such a ceiling board, a magnet cover having such a ceiling board, a magnet system having such a magnet cover, and a magnetic resonance imaging apparatus provided with such a magnet system.

(1) According to one aspect of the invention to solve the problem noted above, there is provided a ceiling board to be supported horizontally by its peripheral parts as fixed parts, the ceiling board characterized in that the part between the fixed parts, in a state wherein it is bent by its own weight, is formed in a dome shape in a direction reverse to the direction of bending by the part's own weight so that the board surface be horizontal.

(2) According to another aspect of the invention to solve the problem noted above, there is provided a ceiling board to be supported horizontally by its peripheral parts and central part as fixed parts, the ceiling board characterized in that the part between the fixed parts, in a state wherein it is bent by its own weight, is formed in a dome shape in a direction reverse to the direction of bending by the part's own weight so that the board surface be horizontal.

(3) According to another aspect of the invention to solve the problem noted above, there is provided a designing method for a ceiling board to be supported horizontally by its peripheral parts as fixed parts, the ceiling board designing method characterized in that the quantity of dome shaping in a direction reverse to the direction of bending of the part between the fixed parts by gravity is equalized to the quantity of bending of the part between the fixed parts by the part's own weight.

(4) According to another aspect of the invention to solve the problem noted above, there is provided a designing method for a ceiling board to be supported horizontally by its peripheral parts and central part as fixed parts, the ceiling board designing method characterized in that the quantity of dome shaping in a direction reverse to the direction of bending of the part between the fixed parts by gravity is equalized to the quantity of bending of the part between the fixed parts by the part's own weight.

(5) According to another aspect of the invention to solve the problem noted above, there is provided a manufacturing method for a ceiling board to be supported horizontally by its peripheral parts as fixed parts, the ceiling board manufacturing method characterized in that the part between the fixed parts, in a state wherein it is bent by its own weight, is formed in a dome shape in a direction reverse to the direction of bending by the part's own weight so that the board surface be horizontal.

(6) According to another aspect of the invention to solve the problem noted above, there is provided a manufacturing method for a ceiling board to be supported horizontally by its peripheral parts and central part as fixed parts, the ceiling board manufacturing method characterized in that the part between the fixed parts, in a state wherein it is bent by its own weight, is formed in a dome shape in a direction reverse to the direction of bending by the part's own weight so that the board surface be horizontal.

(7) According to another aspect of the invention to solve the problem noted above, there is provided a magnet cover, for a magnet body having an upper pole section and a lower pole section opposite to each other with a space between them, having a ceiling board covering the end face of the upper pole section and a floor board covering the end face of the lower pole section, the magnet cover characterized in that the ceiling board is horizontally supported by its peripheral parts as fixed parts, and the part between the fixed parts, in a state wherein it is bent by its own weight, is formed in a dome shape in a direction reverse to the direction of bending by the part's own weight so that the board surface be horizontal.

(8) According to another aspect of the invention to solve the problem noted above, there is provided a magnet cover, for a magnet body having an upper pole section and a lower pole section opposite to each other with a space between them, having a ceiling board covering the end face of the upper pole section and a floor board covering the end face of the lower pole section, the magnet cover characterized in that the ceiling board is horizontally supported by its peripheral parts and central part as fixed parts, and the part between the fixed parts, in a state wherein it is bent by its own weight, is formed in a dome shape in a direction reverse to the direction of bending by the part's own weight so that the board surface be horizontal.

(9) According to another aspect of the invention to solve the problem noted above, there is provided a magnet system having a magnet body having an upper pole section and a lower pole section opposite to each other with a space between them and a magnet cover having a ceiling board covering the end face of the upper pole section and a floor board covering the end face of the lower pole section, the magnet system characterized in that the ceiling board is horizontally supported by its peripheral parts as fixed parts, and the part between the fixed parts, in a state wherein it is bent by its own weight, is formed in a dome shape in a direction reverse to the direction of bending by the part's own weight so that the board surface be horizontal.

(10) According to another aspect of the invention to solve the problem noted above, there is provided a magnet system having a magnet body having an upper pole section and a lower pole section opposite to each other with a space between them and a magnet cover having a ceiling board covering the end face of the upper pole section and a floor board covering the end face of the lower pole section, the magnet system characterized in that the ceiling board is horizontally supported by its peripheral parts and central part as fixed parts, and the part between the fixed parts, in a state wherein it is bent by its own weight, is formed in a dome shape in a direction reverse to the direction of bending by the part's own weight so that the board surface be horizontal.

(11) According to another aspect of the invention to solve the problem noted above, there is provided a magnetic resonance imaging apparatus provided with a magnet system, a patient supporting apparatus for supporting a patient so as to enable him or her to be brought into and out of an imaging space of the magnet system, a signal acquisition means for acquiring magnetic resonance signals from the patient by using the magnet system, and an image generating means for generating an image on the basis of the magnetic resonance signals, the magnetic resonance imaging apparatus characterized in that the magnet system has a magnet body having an upper pole section and a lower pole section opposite to each other with the imaging space between them and a magnet cover having a ceiling board covering the end face of the upper pole section and a floor board covering the end face of the lower pole section, the ceiling board is horizontally supported by its peripheral parts as fixed parts, and the part between the fixed parts, in a state wherein it is bent by its own weight, is formed in a dome shape in a direction reverse to the direction of bending by the part's own weight so that the board surface be horizontal.

(12) According to another aspect of the invention to solve the problem noted above, there is provided a magnetic resonance imaging apparatus provided with a magnet system, a patient supporting apparatus for supporting a patient so as to enable him or her to be brought into and out of an imaging space of the magnet system, a signal acquisition means for acquiring magnetic resonance signals from the patient by using the magnet system, and an image generating means for generating an image on the basis of the magnetic resonance signals, the magnetic resonance imaging apparatus characterized in that the magnet system has a magnet body having an upper pole section and a lower pole section opposite to each other with the imaging space between them and a magnet cover having a ceiling board covering the end face of the upper pole section and a floor board covering the end face of the lower pole section, the ceiling board is horizontally supported by its peripheral parts and central part as fixed parts, and the part between the fixed parts, in a state wherein it is bent by its own weight, is formed in a dome shape in a direction reverse to the direction of bending by the part's own weight so that the board surface be horizontal.

According to any of the aspects of the invention described in (1) through (12), as the part between the fixed parts of the ceiling board is formed in a dome shape in a direction reverse to the direction of bending by the part's own weight so that the board surface be horizontal, the board will never be bent farther downward beyond a horizontal state. Therefore, no trouble due to bending will arise. Incidentally, it is desirable for the ceiling board to have a circular main face with a view to improving its isotropy.

According to the present invention, it is possible to realize a ceiling board free from trouble due to bending, a designing method for such a ceiling board, a manufacturing method for such a ceiling board, a magnet cover having such a ceiling board, a magnet system having such a magnet cover, and a magnetic resonance imaging apparatus provided with such a magnet system.

Further objects and advantages of the present invention will be apparent from the following description of the preferred embodiments of the invention as illustrated in the accompanying drawings.

DETAILED DESCRIPTION OF THE INVENTION

Figure 1:
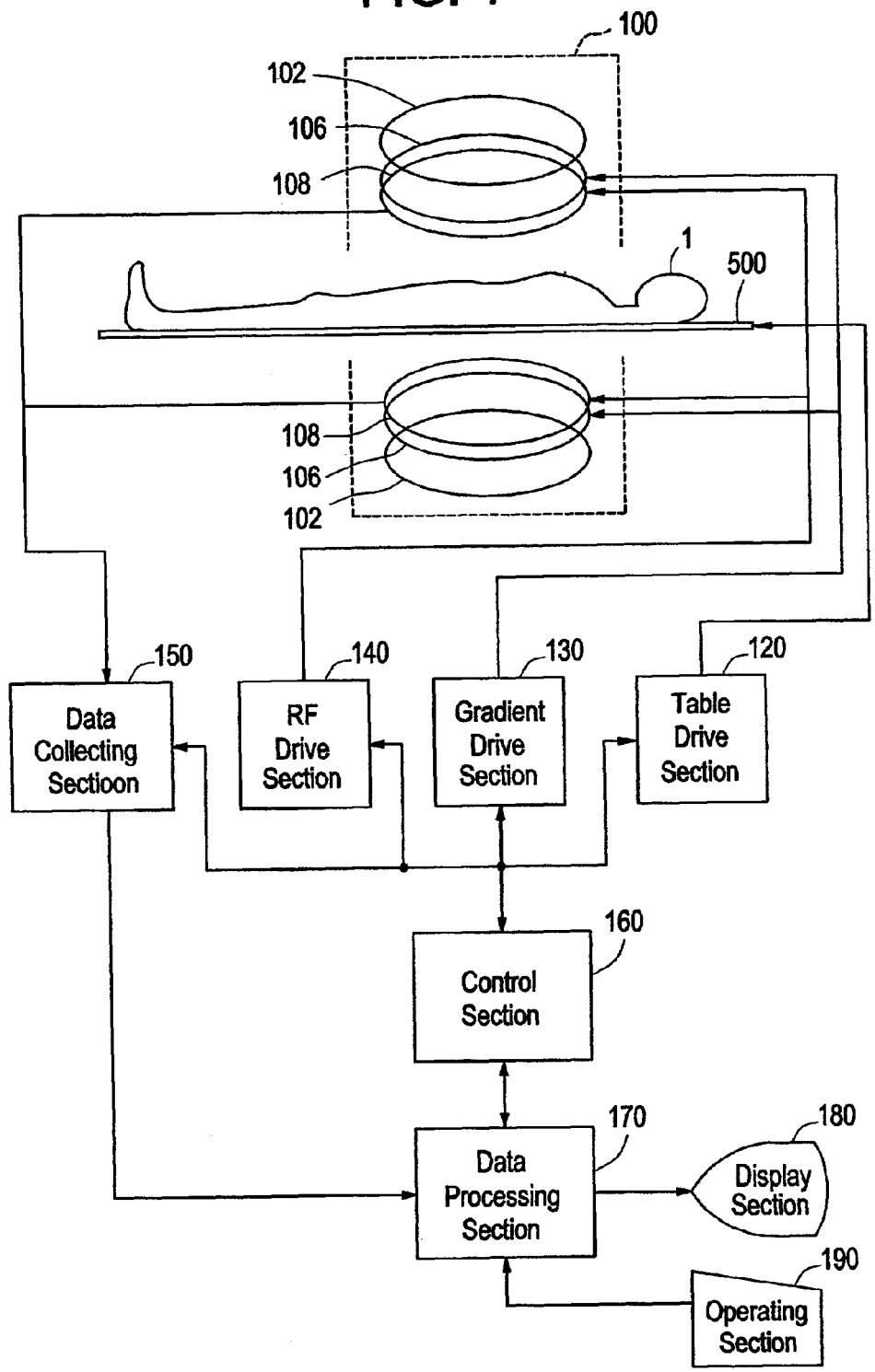
FIG. 1 is a block diagram of an apparatus, which is an example of mode of implementing the present invention.

A mode of carrying out the present invention will be described in detail below with reference to drawings. FIG. 1 is a block diagram of a magnetic resonance imaging apparatus. This apparatus is an example of the mode of implementing the invention. The configuration of this apparatus represents an apparatus, which is an example of the mode of implementing the invention.

As shown in the diagram, the apparatus has a magnet system 100. The magnet system 100 has main magnetic field sections 102, gradient coil sections 106 and RF (radio frequency) coil sections 108. The main magnetic field sections 102, the gradient coil sections 106 and the RF coil sections 108 are all paired ones, one opposite the other with a space between them. Each is substantially disk-shaped, all of them being arranged around a common central axis. The magnet system 100 is an example of the mode of implementing the invention, a magnet system embodying the invention. The magnet system 100 also is an example of implementing a magnet system according to the invention.

The main magnetic field section 102, the gradient coil section 106 and the RF coil section 108 in the magnet system 100 are housed in a magnet cover to be described afterwards.

A subject 1, mounted on a table 500, is brought into and out of the internal space (bore) of the magnet system 100. The table 500 is an example of realizing a patient supporting apparatus according to the invention. The table 500 is driven by a table drive section 120.

The main magnetic field section 102 forms a magnetostatic field in the internal space of the magnet system 100. The direction of the magnetostatic field is substantially orthogonal to that of the bodily axis of the subject 1. Thus it forms a so-called vertical magnetic field. The main magnetic field section 102 is configured of, for instance, a permanent magnet or the like. Incidentally, it may obviously be configured as a superconducting electromagnet, an ordinarily conducting electromagnet or the like, instead of a permanent magnet.

The gradient coil section 106 creates three gradient magnetic fields for giving gradients to respective magnetostatic field intensities in the directions of three mutually normal axes, i.e. a slice axis, a phase axis and a frequency axis. The gradient coil section 106 has three lines of gradient coils (not shown), each matching one or another of the three gradient magnetic fields.

The RF coil section 108 transmits to the magnetostatic field space an RF pulse (radio frequency pulse) for exciting spins within the body of the subject 1. The RF coil section 108 also receives magnetic resonance signals generated by the excited spins. The RF coil section 108 may either be a single coil for both transmission and reception or include separate coils, one for transmission and the other for reception.

To the gradient coil section 106 is connected with a gradient drive section 130. The gradient drive section 130 provides a drive signal to the gradient coil section 106 to cause a gradient magnetic field to be generated. The gradient drive section 130 has three lines of drive circuits (not shown), respectively matching the three lines of gradient coils in the gradient coil section 106.

To the RF coil section 108 is connected with an RF drive section 140. The RF drive section 140 provides a drive signal to the RF coil section 108 to transmit an RF pulse, and excites spins within the body of the subject 1.

To the RF coil section 108 is connected with a data collecting section 150. The data collecting section 150 takes in receive signals received by the RF coil section 108 by sampling, and collects them as digital data.

To the table drive section 120, the gradient drive section 130, the RF drive section 140 and the data collecting section 150 is connected with a control section 160. The control section 160 controls the units from the table drive section 120 through the data collecting section 150 to carry out imaging. The part including the gradient drive section 130, the RF drive section 140 and the data collecting section 150 constitutes an example of realizing a signal acquisition means according to the present invention.

The control section 160 is configured by using, for instance, a computer or the like. The control section 160 has a memory (not shown). The memory stores programs for the control section 160 and various data. The functions of the control section 160 are realized by the execution of programs stored in the memory by the computer.

The output side of the data collecting section 150 is connected to a data processing section 170. Data collected by the data collecting section 150 are inputted to the data processing section 170. The data processing section 170 is configured by using, for instance, a computer or the like. The data processing section 170 has a memory (not shown). The memory stores programs for the data processing section 170 and various data.

The data processing section 170 is connected to the control section 160. The data processing section 170 is positioned superior to, and exercises general control over, the control section 160. The functions of this apparatus are realized by the execution of programs, stored in the memory, by the data processing section 170.

The data processing section 170 stores data, collected by the data collecting section 150, into the memory. A data space is formed within the memory. This data space constitutes a two-dimensional Fourier space. The Fourier space will also be referred to as the k-space hereinafter. The data processing section 170 reconstructs an image of the subject 1 by subjecting data in the k-space to a two-dimensional inverse Fourier transform. The data processing section 170 constitutes an example of realizing an image generation means according to the present invention.

To the data processing section 170 is connected with a display section 180 and an operating section 190. The display section 180 is configured of a graphic display or the like. The operating section 190 is constituted of a keyboard or the like, provided with a pointing device.

The display section 180 displays reconstructed images and various information outputted from the data processing section 170. The operating section 190 is operated by the user to input various commands, information and so forth to the data processing section 170. The user interactively operates this apparatus through the display section 180 and the operating section 190.

Figure 2:
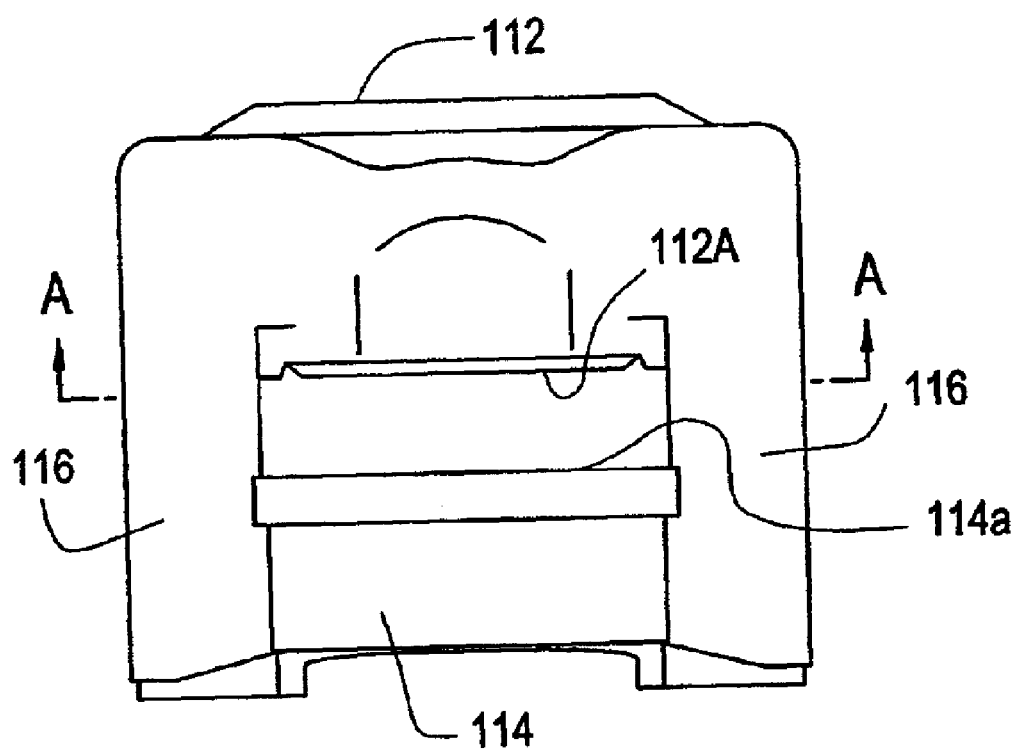
FIG. 2 is a schematic diagram showing external looks of a magnet cover.
Figure 3:
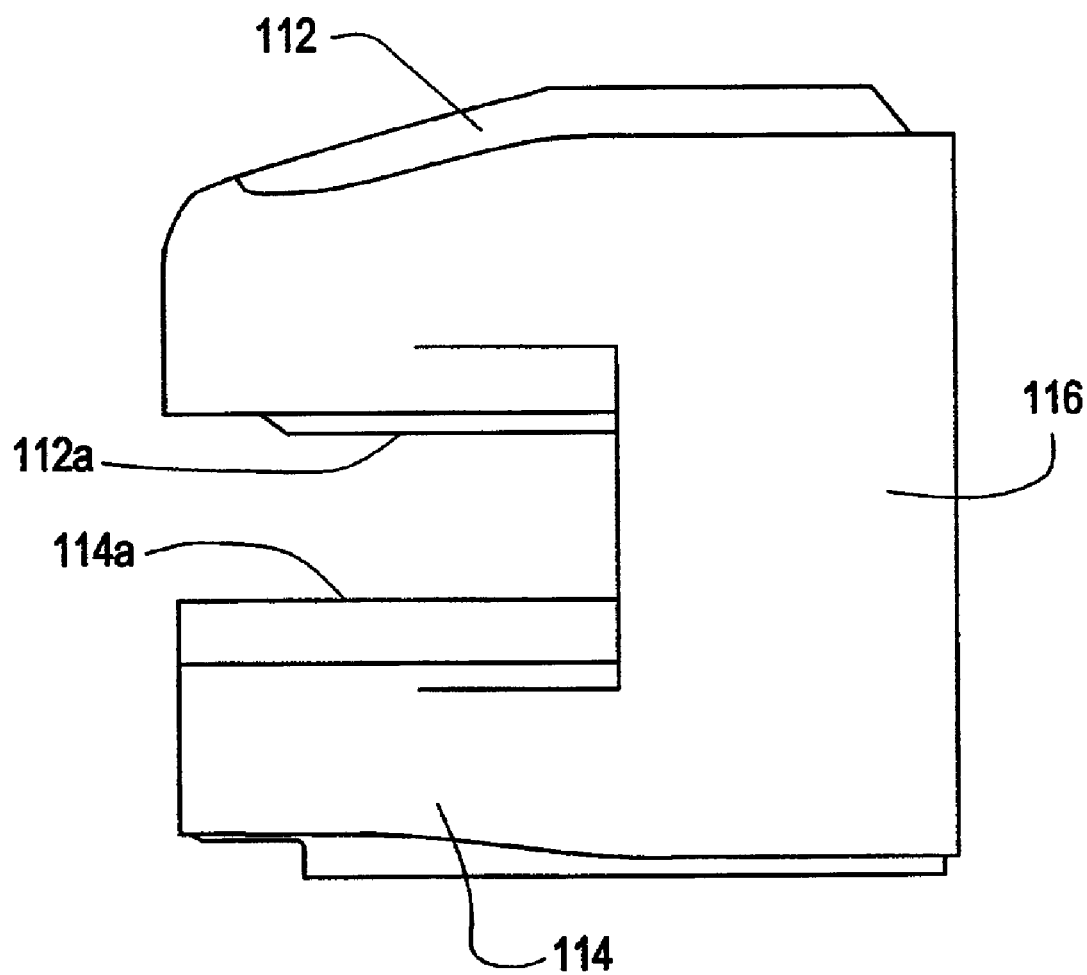
FIG. 3 is another schematic diagram showing external looks of the magnet cover.
Figure 4:
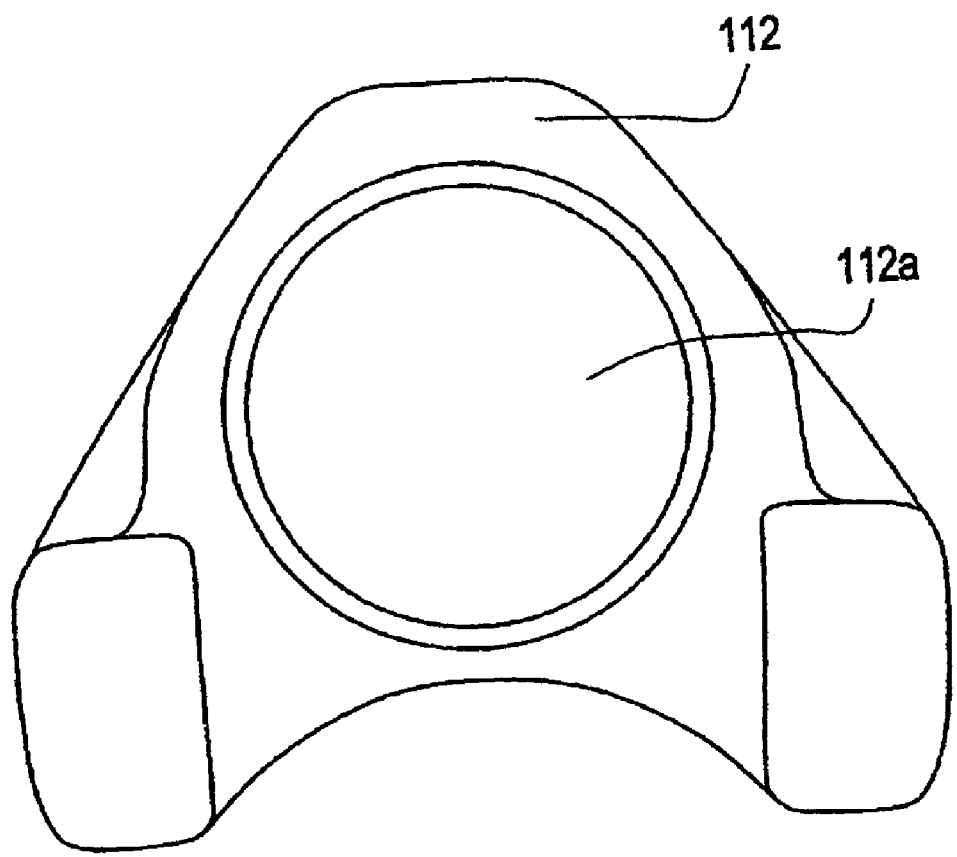
FIG. 4 is a schematic diagram of the A—A section in FIG. 2.

The magnet cover will be described now. FIG. 2, FIG. 3 and FIG. 4 schematically illustrate the external looks of the magnet cover. FIG. 2 shows a front view; FIG. 3, a profile; and FIG. 4, an A—A section with reference to FIG. 2. The magnet cover illustrated in these drawings is an example of magnet cover in the mode of implementing the invention. As shown in these drawings, the magnet cover has an upper cover 112, a lower cover 114 and a pair of support covers 116.

The bottom face of the upper cover 112 constitutes a ceiling board 112*a*. The top face of the lower cover 114 constitutes a floor board 114*a*. The ceiling board 112*a* is an example of ceiling board in the mode of implementing the invention. The floor board 114*a* is an example of floor board in the mode of implementing the invention.

A patient 1 is brought into the space between the ceiling board 112*a* and the floor board 114*a* using the table 500. The ceiling board 112a and the floor board 114a are configured of a non-magnetic and electrically insulating material, such as plastics for instance.

Figure 7:
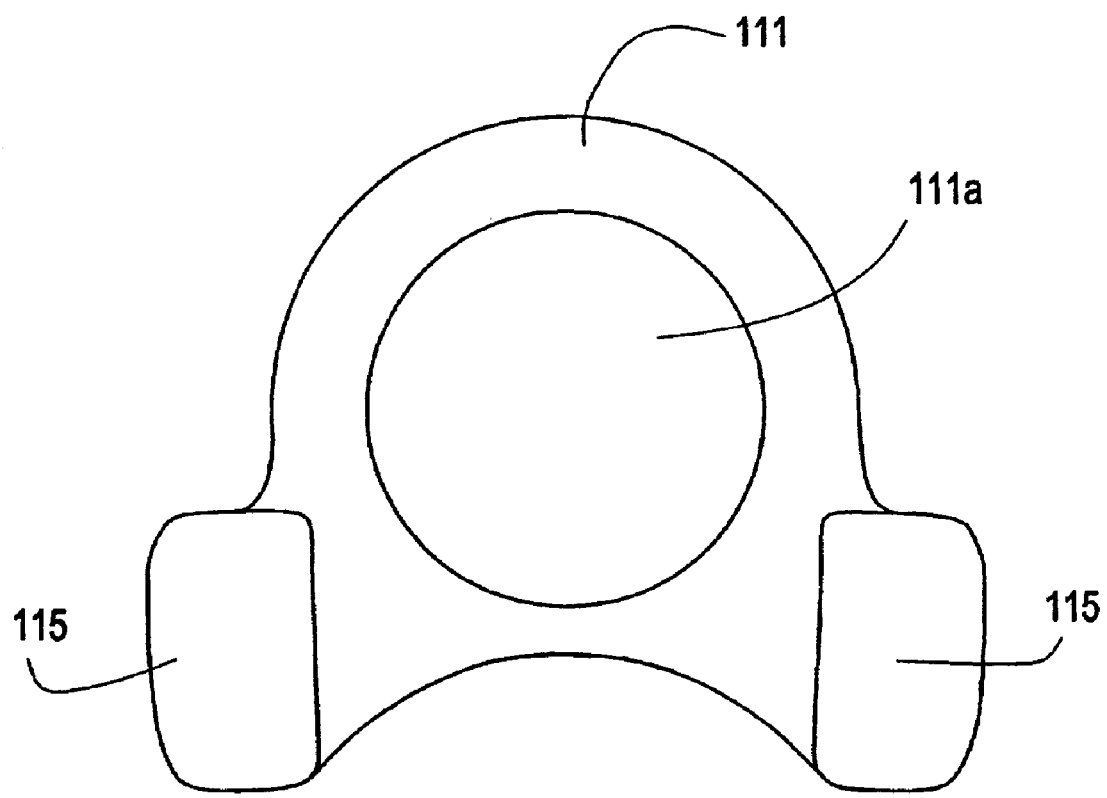
FIG. 7 is a schematic diagram of the B—B section in FIG. 5.
Figure 5:
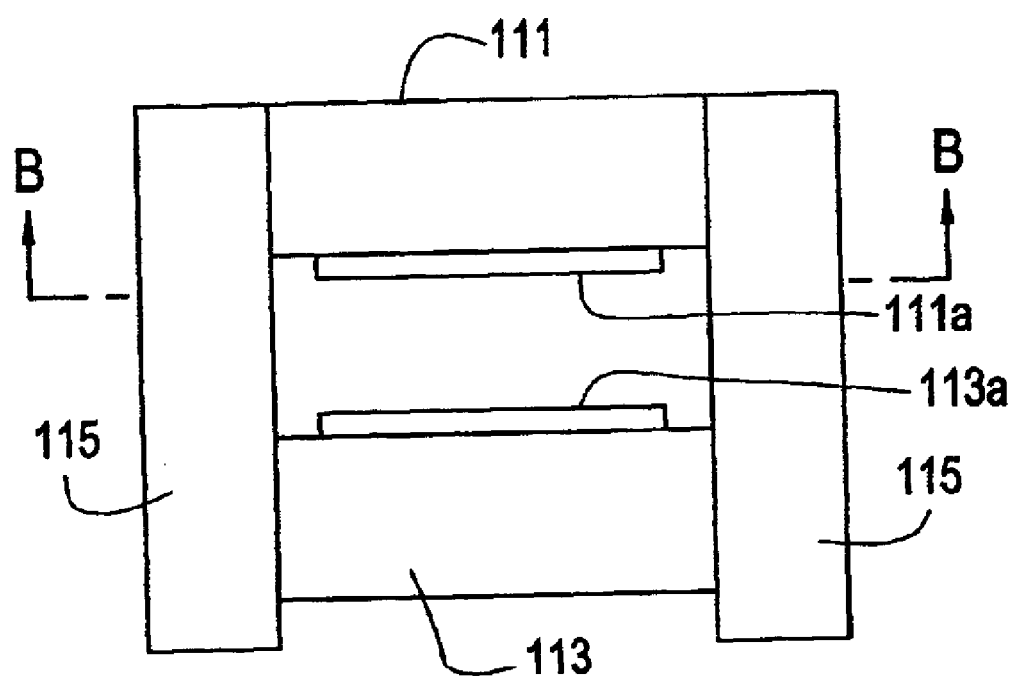
FIG. 5 is a schematic diagram showing external looks of a magnet body.
Figure 6:
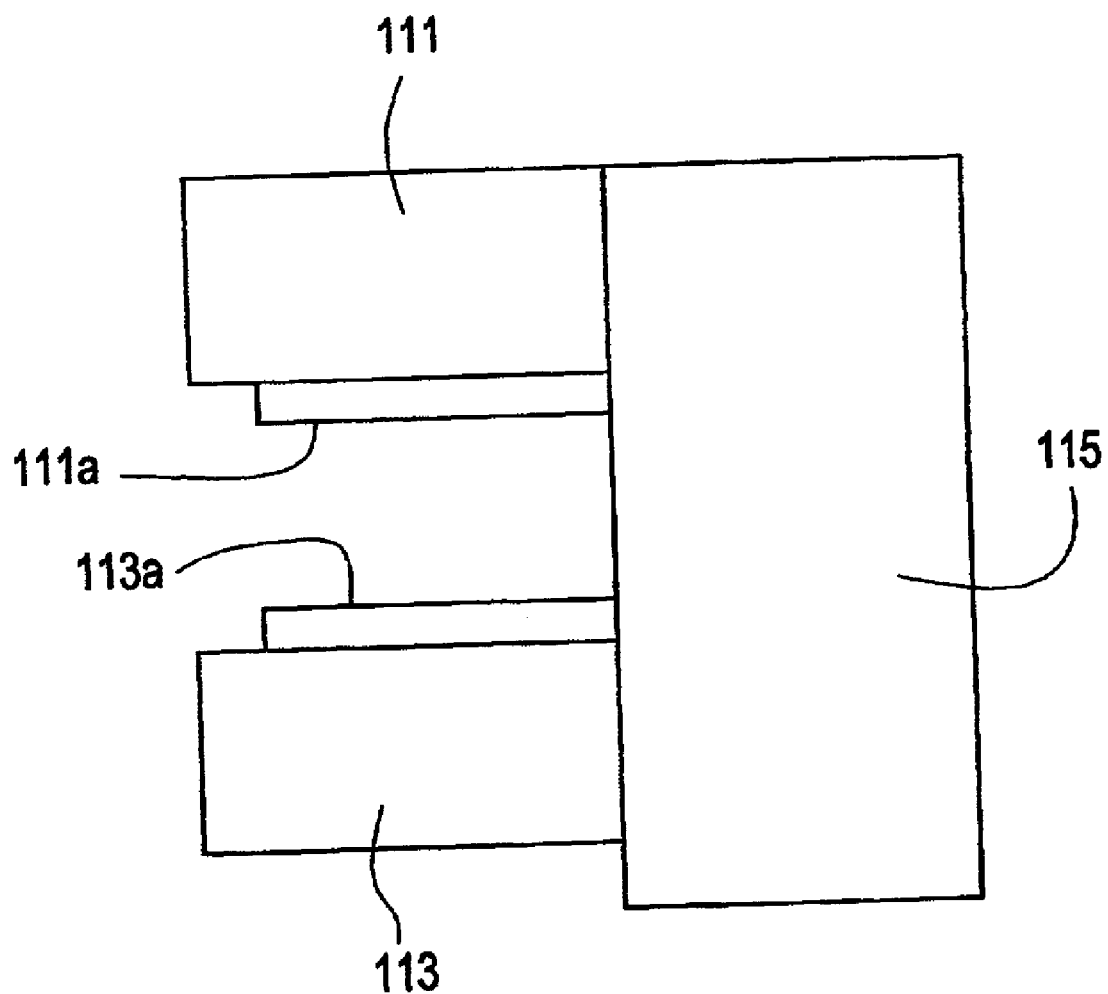
FIG. 6 is another schematic diagram showing external looks of the magnet body.

A magnet body is housed in such a magnet cover. FIG. 5, FIG. 6 and FIG. 7 schematically illustrate the external looks of the magnet body. FIG. 5 shows a front view; FIG. 6, a profile; and FIG. 7, a B—B section with reference to FIG. 5. As shown in these drawings, the magnet body has an upper structure 111, a lower structure 113 and a pair of supports 115. The magnet body shown in these drawings is an example of magnet body in the mode of implementing the invention.

The bottom part of the upper structure 111 constitutes a columnar upper pole section 111a. The top part of the lower structure 113 constitutes a columnar lower pole section 113a. Each of the upper pole section 111a and the lower pole section 113a includes a main magnetic field section 102, a gradient coil section 106 and an RF coil section 108. The upper pole section 111a and the lower pole section 113a are examples of the upper pole section and the lower pole section, respectively, in the mode of implementing the invention.

Figure 8:
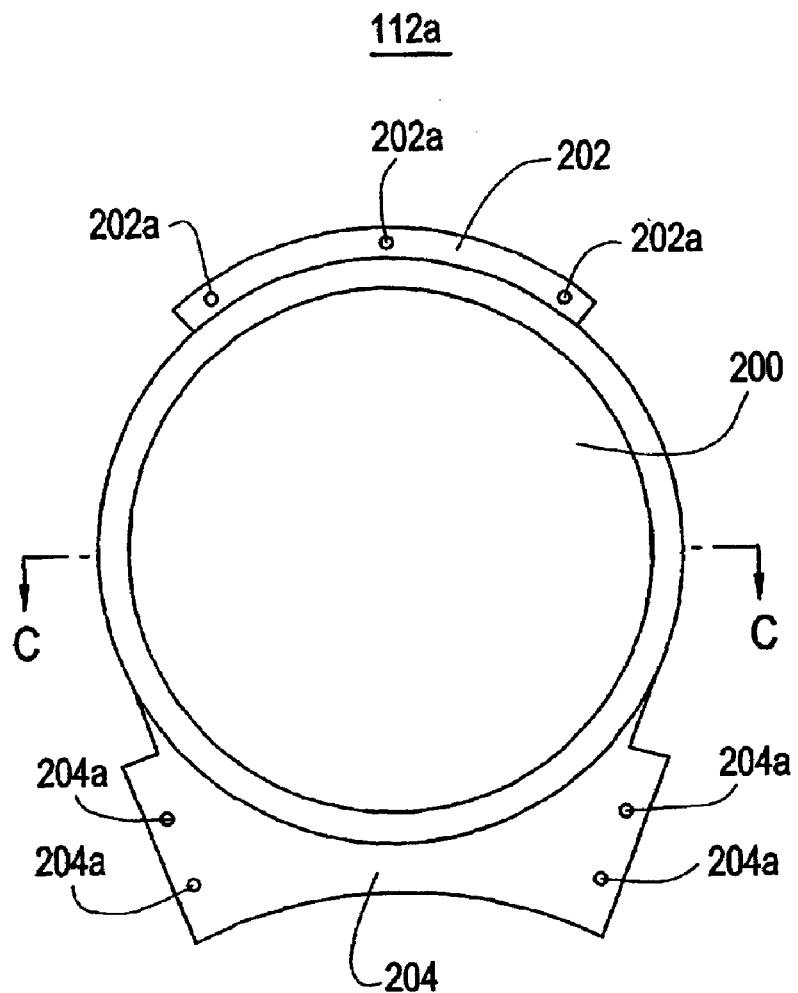
FIG. 8 is a plan of a ceiling board.

FIG. 8 shows a plan of the ceiling board 112a. As illustrated in the drawing, the ceiling board 112a has a circular pan section 200. The pan section 200, constituting the main body of the ceiling board 112a, has an adequate shape and size for covering the lower face of the upper pole section 111a. The pan section 200 has ear sections 202 and 204 on its periphery. The ceiling board 112a, using holes 202a and 204a bored in these ear sections 202 and 204, are fixed to the magnet body the upper structure 111.

Figure 9:
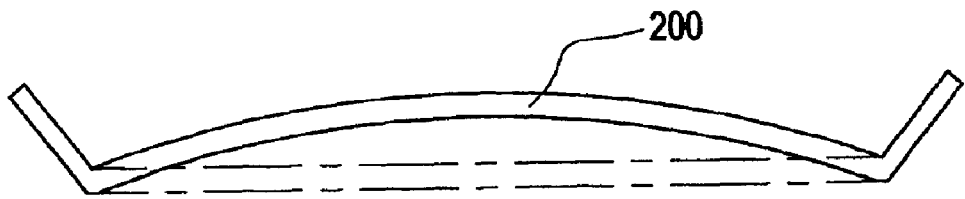
FIG. 9 is a schematic diagram showing a sectional shape of the ceiling board.

FIG. 9 schematically shows the C—C section of the ceiling board 112a. As illustrated in the drawing, the pan section 200 is shaped to constitute an easily sloped dome. It is so shaped to a sufficient extent for the board surface of the pan section 200 to become horizontal as indicated by the one-dot chain line when the ceiling board 112a is made horizontal as it is bent by its own weight.

Since this dome shape only makes the board surface horizontal, even if the ceiling board 112a is bent by its own weight, its distance from the floor board 114a is kept as prescribed, but not shortened. Therefore, no trouble will arise even if a patient with a head coil, i.e. an RF coil for exclusive use on the head, is brought in.

Figure 10:
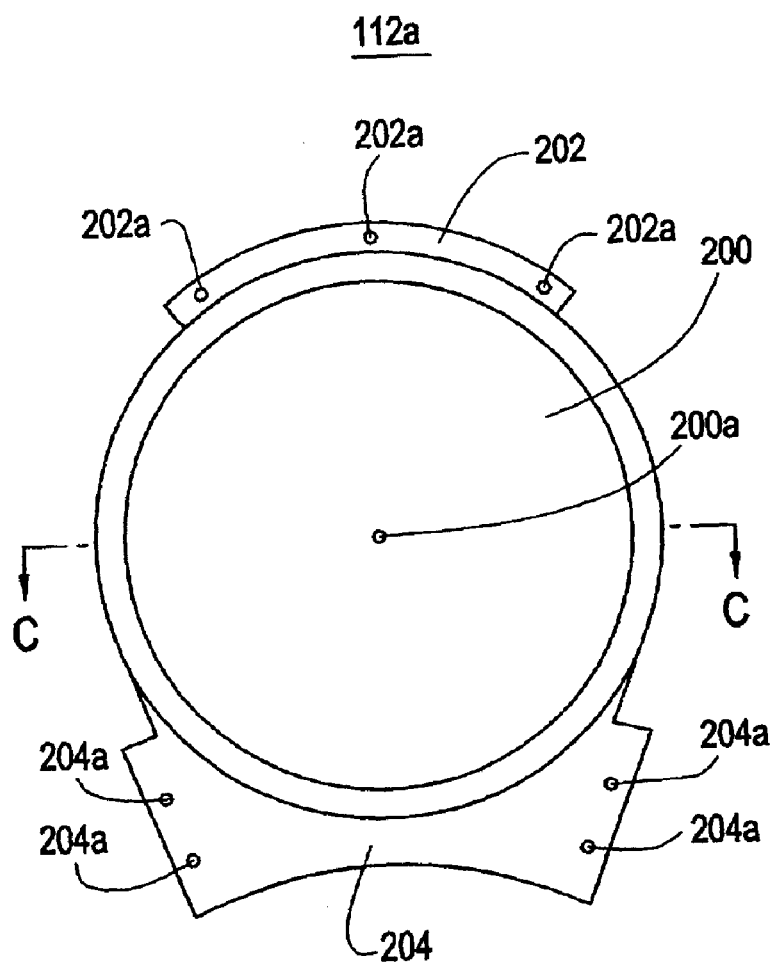
FIG. 10 is another plan of a ceiling board.
Figure 11:
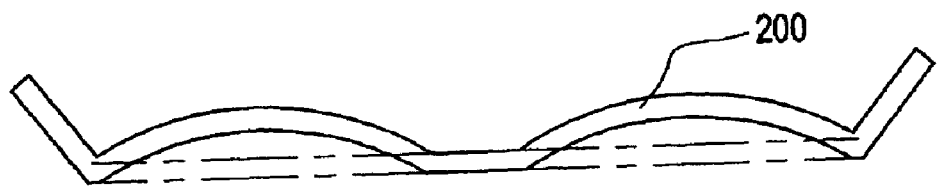
FIG. 11 is another schematic diagram showing a sectional shape of the ceiling board.

The ceiling board 112a may have a hole 200a bored in its central part as illustrated in FIG. 10 to fix the central part, using this hole 200a, to the upper structure 111 of the magnet body by, for instance, screwing. In that case, the pan section 200 is so shaped, as shown in FIG. 11, that both sides of the central part constitute a dome shape throughout its circumference. It is so shaped to a sufficient extent for the board surface of the pan section 200 to become horizontal as indicated by the one-dot chain line when the ceiling board 112a is made horizontal as it is bent by its own weight.

This dome shape prevents, even if the ceiling board 112a is bent by its own weight, its distance from the floor board 114a from being shortened. Therefore, no trouble will arise even if a patient with a head coil, i.e. an RF coil for exclusive use on the head, is brought in.

Figure 12:
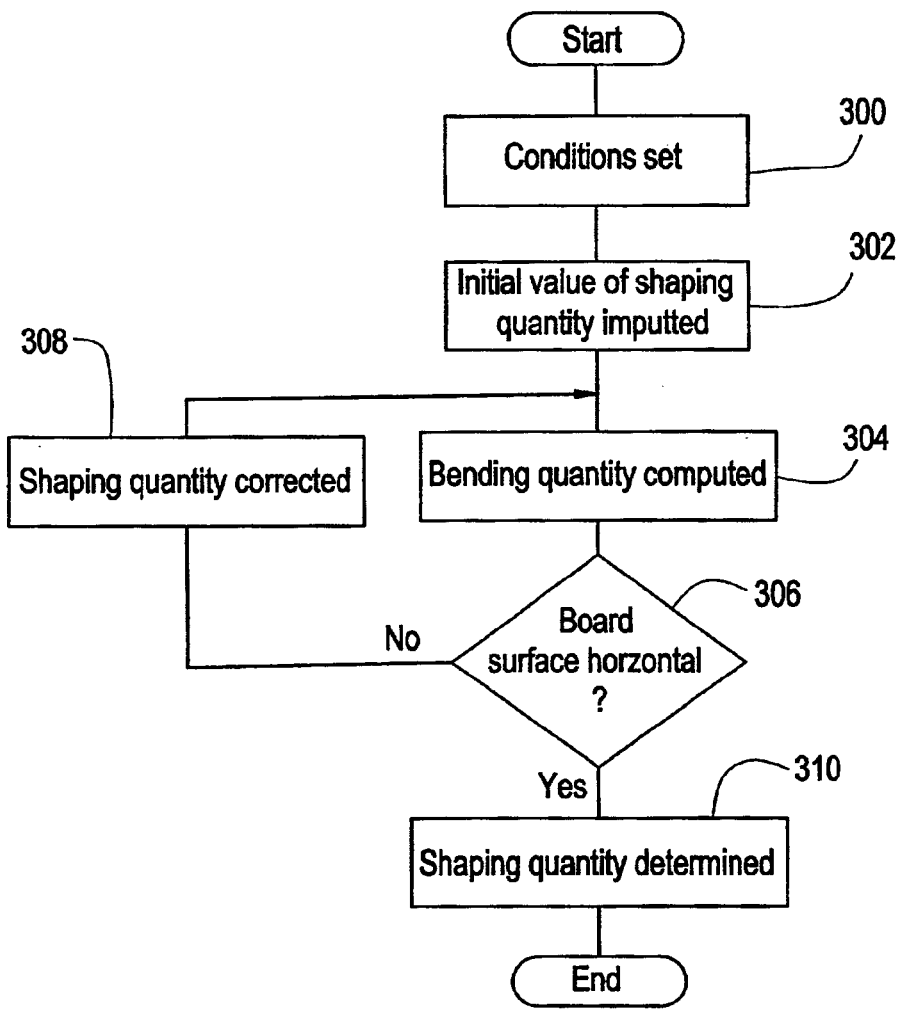
FIG. 12 is a chart of a flow to compute the quantity of shaping.

The extent of this dome shaping can be computed by computerized simulation. FIG. 12 shows a flow chart of the procedure of computing the extent of shaping. This flow chart shows an example of implementing the designing method according to the present invention.

As charted in the drawing, conditions are set at step 300. This condition setting results in the setting of a model for use in designing by a finite element method. The model has the same size and shape as the ceiling board excluding the quantity of the dome shape. The set conditions also include the Young's modulus and mechanical constants regarding the ceiling board material, such as the coefficient of rigidity for instance.

Then at step 302, the initial value of the quantity of shaping is inputted.

Next at step 304, the quantity of bending of the ceiling board, having a dome shape formed exactly to the initial value, due to its own weight is computed. The quantity of bending is computed by a finite element method. Out of available finite element methods, a displacement method supposing the quantity of displacement to be unknown is used.

Then at step 306, it is judged whether or not the board surface of the ceiling board is horizontal in the bent state.

If the board surface is not horizontal, the quantity of shaping is corrected at step 308; at step 304, the bending of a dome having a new quantity of shaping due to bending is computed and, at step 306, it is judged whether or not the board surface is horizontal. These steps are repeated thereafter to correct the quantity of shaping consecutively and, when a quantity of shaping that makes the board surface horizontal, the quantity of shaping is determined at step 310.

Figure 13:
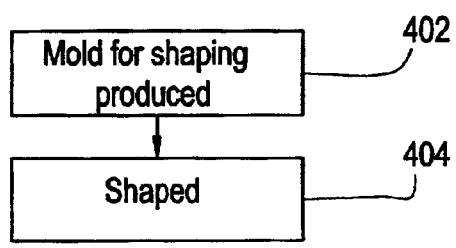
FIG. 13 is a drawing illustrating the sequence of steps for manufacturing the ceiling board.

The ceiling board 112a designed in this manner is manufactured in, for instance, the sequence of steps illustrated in FIG. 13. The sequence shown in the drawing is an example of manufacturing method in the mode of implementing the invention. As shown therein, a mold for use in shaping is produced at step 402. In the production of the mold, the designed value of the quantity of shaping is used. Next at step 404, using that mold, the ceiling board 112a is shaped.

Whereas the present invention has been described so far with reference to examples of a preferred mode of implementing it, persons having usual knowledge in the technical field to which the invention belongs can apply various modifications or substitutions to these examples of the mode of implementation without deviating from the technical scope of the invention. Therefore, the technical scope of the invention includes not only the above-described examples of the mode of implementation but all the modes of implementation covered by the scope of claims for the patent.

What is claimed is:

1. A magnetic resonance imaging apparatus provided with a magnet system comprising:

a patient supporting apparatus for supporting a patient so as to enable him or her to be brought into and out of an imaging space of said magnet system, a signal acquisition means for acquiring magnetic resonance signals from said patient by using said magnet system, an image generating means for generating an image on the basis of said magnetic resonance signals, a magnet body having an upper pole section and a lower pole section opposite to each other with said imaging space between them; and a magnet cover having a ceiling beard covering the end face of said upper pole section and at floor board covering the end face of said lower pole section, said ceiling board comprising:

a pan section comprising a central portion configured to be fixedly attached to an upper structure; and a plurality of car sections fixedly attached to said pan section, said pan section supported horizontally by said ear sections, said pan section in a state wherein it is bent by its own weight, and is formed in a dome shape in a direction reverse to the direction of bending by said pan section's own weight so that a surface of the ceiling board is horizontal.

2. A magnetic resonance imaging apparatus provided with a magnet system comprising:
   a patient supporting apparatus for supporting a patient so as to enable the patient to be brought into and out of an imaging space of said magnet system,
   a signal acquisition means for acquiring magnetic resonance signals from the patient by using said magnet system,
   an image generating means for generating an image on the basis of said magnetic resonance signals,
   a magnet body having an upper pole section and is lower pole section opposite said upper pole section with a space between said upper pole section and said lower pole section; and
   a magnet cover having a ceiling board covering an end face of said upper pole section and a floor board coveting an end face of said lower pole section, said ceiling board comprising:
   a pan section; and
   a plurality of ear sections fixedly attached to said pan section such that said pan section is supported horizontally by said car sections, said pan section in a state wherein it is bent by its own weight, is formed in a dome shape in a direction reverse to the direction of bending by said pan section's own weight so that the ceiling board surface is horizontal.

3. The magnetic resonance imaging apparatus of claim 2 wherein said ceiling board has a circular main face.

4. A magnet system having
   a magnet body having an upper pole section and a lower pole section opposite said upper pole section with a space between said upper pole section and said lower pole section; and
   a magnet cover having a ceiling board covering an end face of said upper pole section and a floor board covering an end face of said lower pole section, said ceiling board comprising:
   a pan section comprising a central portion configured to be fixedly attached to an upper structure; and
   a plurality of ear sections fixedly attached to said pan section, said pan section supported horizontally by said ear sections, said pan section in a state wherein it is bent by its own weight, and is formed in a dome shape in a direction reverse to the direction of bending by said pan section's own weight so that a surface of the ceiling board is horizontal.

5. A magnet system having
   a magnet body having an upper pole section and a lower pole section opposite said upper pole section with a space between said upper pole section and said lower pole section; and
   a magnet cover having a ceiling board covering an end face of said upper pole section and a floor board covering an end face of said lower pole section, said ceiling board comprising:
   a pan section; and
   a plurality of ear sections fixedly attached to said pan section, said pan section supported horizontally by said car sections, said pan section in a state wherein it is bent by its own weight, and is formed in a dome shape in direction reverse to the direction of bending by said pan section's own weight so that a surface of the ceiling board is horizontal.

6. The magnet cover of claim 5 wherein said ceiling board has a circular main face.

7. A magnet cover, for a magnet body having
   an upper pole section;
   a lower pole section opposite said upper pole section with a space between said upper pole section and said lower said section; and
   a ceiling board covering an end face of said lower pole section, said ceiling board comprising:
   a pan section comprising a central portion configured to be fixedly attached to an upper structure; and
   a plurality of ear sections fixedly attached to said pan section, said pan section supported horizontally by said ear sections, said pan section in a state wherein it is bent by its own weight, and is formed in a dome shape at a direction reverse to the direction of bending by said pan section's own weight so that a surface of the ceiling board is horizontal.

8. A magnet cover, for a magnet body having
   an upper pole section;
   a lower pole section opposite said upper pole section with a space between said upper pole section and said lower pole section; and
   a ceiling board covering an end face of said upper pole section and a floor board covering an end face of the lower pole section, said ceiling board comprising:
   a pan section; and
   a plurality of ear sections fixedly attached to said pan section, said pan section supported horizontally by said ear sections, said pan section in a state wherein it is bent by its own weight, and is formed in a dome shape in a direction reverse to the direction of bending by said pan section's own weight so that a surface of the ceiling board is horizontal.

9. The magnet cover of claim 8 wherein said ceiling board has a circular main face.

10. A manufacturing method for a ceiling board, said ceiling board comprising:
    a pan section comprising a central portion configured to be fixedly attached to an upper structure; and
    a plurality of ears sections fixedly to said pan section, said pan section supported horizontally by said ear sections, said pan section in a state wherein it is bent by its own weight, and is formed in a dome shape in a direction reverse to the direction of bending by said pan section's own weight so that a surface of the ceiling board is horizontal.

11. A manufacturing method for a ceiling board, said ceiling board comprising:
    a pan section; and
    a plurality of car sections fixedly attached to said pan section, said pan section supported horizontally by said ear sections, said pan section in a state wherein it is bent by its own weight, and is formed in a dome shape in a direction reverse to the direction of bending by said pan section's own weight so that a surface of the ceiling board is horizontal.

12. The ceiling board manufacturing method of claim 11 wherein said ceiling board has a circular main face.

13. The ceiling board manufacturing method of claim 11 wherein said shaping is accomplished by using a mold.

14. A designing method for a ceiling board comprising:
a pan section comprising a central portion configured to be fixedly attached to an upper structure; and
a plurality of ear sections fixedly attached to said pan section, said pan section supported horizontally by said ear sections, said method comprising equalizing the quantity of pan shaping, caused by gravity, in a direction reverse to the direction of bending of the pan between said ear sections to the quantity of bending of the pan between said ear sections caused by the pan's own weight.

15. A designing method for a ceiling board comprising:
a pan section; and
a plurality of ear sections fixedly attached to said pan section, said pan section supported horizontally by said ear sections, said method comprising equalizing the quantity of pan shaping, caused by gravity, in a direction reverse, to the direction of bending of the pan between said ear sections to the quantity of bending of the pan between said ear sections caused by the pan's own weight.

16. The ceiling board designing method of claim 15 wherein said ceiling board has a circular main face.

17. The ceiling board designing method of claim 15 wherein said designing is accomplished by a finite element method.

18. A ceiling board comprising:
a pan section comprising a central portion configured to be fixedly attached to an upper structure; and
a plurality of ear sections fixedly attached to said pan section, said pan section supported horizontally by said ear sections, said pan section in a state wherein it is bent by its own weight, and is formed in a dome shape in a direction reverse to the direction of bending by said pan section's own weight so that a surface of the ceiling board is horizontal.

19. A ceiling board comprising:
a pan section; and
a plurality of ear sections fixedly attached to said pan section, said pan section supported horizontally by said ear sections, said pan section in a state wherein it is bent by its own weight, and is formed in a dome shape in a direction reverse to the direction of bending by said pen section's own weight so that a surface of the ceiling board is horizontal.

20. The ceiling board of claim 19 wherein said ceiling board has a circular main face.

21. The ceiling board of claim 18 wherein said ceiling board has a circular main face.

22. The ceiling board designing method of claim 14 wherein said ceiling board has a circular main face.

23. The ceiling beard designing method of claim 14 wherein said designing is accomplished by a finite element method.

24. The ceiling board manufacturing method claim 10 wherein said ceiling board has a circular main face.

25. The ceiling board manufacturing method of claim 10 wherein said shaping is accomplished by using a mold.

26. The magnet cover of claim 7 wherein said ceiling board has a circular main face.

27. The magnet cover of claim 4 wherein said ceiling board has a circular main face.

28. The magnetic resonance imaging apparatus of claim 1 wherein said ceiling board has a circular main face.

* * * * *

UNITED STATES PATENT AND TRADEMARK OFFICE
CERTIFICATE OF CORRECTION

| | |
|---|---|
| PATENT NO. | : 6,969,990 B2 |
| APPLICATION NO. | : 10/165154 |
| DATED | : November 29, 2005 |
| INVENTOR(S) | : Udo et al. |

It is certified that error appears in the above-identified patent and that said Letters Patent is hereby corrected as shown below:

In Claim 1, column 8, line 58, delete "beard" and insert therefor -- board --.
In Claim 1, column 8, line 59, delete "and at floor" and insert therefor -- and a floor --.
In Claim 1, column 8, line 64, delete "car sections" and insert therefor -- ear sections --.
In Claim 2, column 9, line 16, delete "and is lower" and insert therefor -- and a lower --.
In Claim 2, column 9, line 22, delete "coveting" and insert therefor -- covering --.
In Claim 2, column 9, line 27, delete "car sections" and insert therefor -- ear sections --.
In Claim 5, column 9, line 67, delete "car sections" and insert therefor -- ear sections --.
In Claim 5, column 10, beginning on line 1, between "in" and "direction" insert -- a --.
In Claim 7, column 10, line 11, delete "lower said section" and insert therefor -- lower pole section --.
In Claim 7, column 10, line 19, delete "shape at a" and insert therefor -- shape in a --.
In Claim 10, column 10, line 45, delete "ears sections" and insert therefor -- ear sections --.
In Claim 10, column 10, line 45, between "fixedly" and "to" insert -- attached --.
In Claim 11, column 10, line 55, delete "car sections" and insert therefor -- ear sections --.
In Claim 14, column 11, line 6, delete "car sections" and insert therefor -- ear sections --.
In Claim 15, column 11, line 14, delete "car sections" and insert therefor -- ear sections --.
In Claim 15, column 11, line 18, delete "reverse, to" and insert therefor -- reverse to --.
In Claim 19, column 12, line 10, delete "said pen" and insert therefor -- said pan --.
In Claim 23, column 12, line 19, delete "beard" and insert therefor -- board --.
In Claim 24, column 12, line 22, between "method" and "claim" insert -- of --.

Signed and Sealed this

Twenty-fifth Day of December, 2007

JON W. DUDAS
*Director of the United States Patent and Trademark Office*